(12) United States Patent
Hayami et al.

(10) Patent No.: US 6,661,761 B2
(45) Date of Patent: Dec. 9, 2003

(54) REPRODUCING APPARATUS FOR OPTICAL DISC RECORDED IN HIGH DENSITY

(75) Inventors: Atsushi Hayami, Kanagawa-ken (JP); Junichiro Tonami, Kanagawa-ken (JP)

(73) Assignee: Victor Company of Japan, Limited, Kanagawa-ken (JP)

( * ) Notice: Subject to any disclaimer, the term of this patent is extended or adjusted under 35 U.S.C. 154(b) by 414 days.

(21) Appl. No.: 09/849,981

(22) Filed: May 8, 2001

(65) Prior Publication Data
US 2002/0012306 A1 Jan. 31, 2002

(30) Foreign Application Priority Data

May 12, 2000 (JP) ........................................ 2000-139692
Mar. 16, 2001 (JP) ........................................ 2001-075691

(51) Int. Cl.[7] ............................................... G11B 7/00
(52) U.S. Cl. .............................. 369/59.21; 369/124.05
(58) Field of Search .................... 369/59.21, 59.22, 369/59.17, 59.19, 59.2, 124.05, 124.07, 124.11, 124.12, 124.13, 124.14, 47.18, 47.35, 53.35, 53.19

(56) References Cited

U.S. PATENT DOCUMENTS

| | | | |
|---|---|---|---|
| 5,561,647 A | * 10/1996 | Kayanuma | 369/47.27 |
| 5,586,100 A | * 12/1996 | Lee et al. | 369/59.16 |
| 5,623,474 A | * 4/1997 | Oshio et al. | 369/47.15 |
| 5,677,802 A | * 10/1997 | Saiki et al. | 360/51 |
| 5,680,380 A | * 10/1997 | Taguchi et al. | 369/47.35 |
| 5,870,372 A | * 2/1999 | Kuribayashi | 369/53.19 |
| 6,118,746 A | * 9/2000 | Verboom | 369/59.21 |
| 6,192,016 B1 | * 2/2001 | Kim | 369/59.2 |
| 6,304,538 B1 | * 10/2001 | Hayashi | 369/124.05 |
| 6,445,662 B1 | * 9/2002 | Tonami | 369/59.21 |
| 6,577,568 B1 | * 6/2003 | Konishi et al. | 369/44.32 |
| 6,587,407 B1 | * 7/2003 | Nakamura et al. | 369/124.11 |

\* cited by examiner

Primary Examiner—Thang V. Tran
(74) Attorney, Agent, or Firm—Nath & Associates PLLC (57) ABSTRACT

A resampling DPLL estimates a signal outputted from a pickup through an AGC and outputs a signal of the estimation result. A transversal filter in an adaptive equalizing circuit equalizes in waveform the signal outputted from the resampling DPLL. An error signal is detected from the equalized waveform outputted from the transversal filter. The error signal is fed back to the transversal filter so as to control the transversal filter such that the error signal becomes minimum.

10 Claims, 9 Drawing Sheets

CROSS-TALK COMPONENT

FIG.10B

WAVEFORM EQUALIZING SIGNAL
HAVING CROSS-TALK

FIG.10C

DETECTED CROSS-TALK

REPRODUCING APPARATUS FOR OPTICAL DISC RECORDED IN HIGH DENSITY

CROSS REFERENCE TO RELATED APPLICATION

This application claims benefit of priority under 35 U.S.C. §119 to Japanese Patent Applications No.2000-139692, filed on May 12, 2000, and No.2001-75691, filed on Mar. 16, 2001, the entire contents of which are incorporated by reference herein.

BACKGROUND OF THE INVENTION

1. Field of the Invention

The present invention relates to an optical disc reproducing apparatus for reproducing digital information from an optical disc medium in which the digital information is modulated and recorded in a recording track formed coaxially or spirally according to signal modulation method for restricting run length for limiting the recording mark length, and more particularly to an optical disc reproducing apparatus having a laser of 390 to 440 nm in wavelength for reproducing information from a high density read only memory (ROM) or from rewritable disc in which the information is recorded such that a recording mark in the optical disc medium is 0.32 $\mu$m or more to less than 0.38 $\mu$m in track pitch and 0.12 $\mu$m or more to less than 0.22 $\mu$m in mark length.

2. Description of the Related Art

Since before, as a means for reproducing information from a high-density ROM disc, a reproducing apparatus provided with a combination of a partial response equalization and viterbi decoding using run length restriction in recording modulation has been disclosed in, for example, Pioneer R&D Vol. 6. No.2 "Development of Viterbi Decoder for DVD" and Japanese Patent Application Laid-Open No. H10-106161.

Although prior arts disclosed in these document and publication contribute largely to a reproducing apparatus for reproducing from a medium having a recording density of DVD or similar capacity, in a reproducing apparatus for reproducing from a higher density ROM (read only) disc (hereinafter sometimes referred to as simply ROM disc), nonlinear distortion caused in pit formation and cross-talk between adjacent tracks are increased tremendously, so that no sufficient margin can be secured due to disc tilt and the like, thereby making it impossible to construct any reproducing apparatus. Further, the rewritable disc has a similar problem caused by a recording power deviation or the like.

SUMMARY OF THE INVENTION

To solve the above described problem, the present invention intends to provide an optical disc reproducing apparatus capable of suppressing nonlinear distortion caused by pit formation, an influence by cross-talk between adjacent tracks, an influence by disc tilt and the like to a minimum extent in a high-recording density ROM disc in which a recording mark is 0.32 $\mu$m or more to less than 0.38 $\mu$m in track pitch and 0.12 $\mu$m or more to less than 0.22 $\mu$m in mark length, the apparatus using laser beam of 390 to 440 nm in wavelength.

0.22 $\mu$m and 0.38 $\mu$m which are upper limits of the length dimension and track pitch respectively are specified as values allowing recording of information with practically sufficient capacity for an optical disc medium of 12 cm in diameter. On the other hand, 0.12 $\mu$m is a lower limit of the length dimension and is specified as a value within its practical limit not to increase jitters rapidly due to thermal interference between adjacent marks. Further, 0.32 $\mu$m, which is a lower limit of the track pitch is a value specified by manufacturing limit for the disc.

To achieve the above object, there is provided an optical disc reproducing apparatus for reproducing digital information from an optical disc medium in which the information is modulated and recorded in a recording track formed coaxially or spirally according to a signal modulation method for restricting run length such that a recording mark is 0.32 $\mu$m or more to less than 0.38 $\mu$m in track pitch and 0.12 $\mu$m or more to less than 0.22 $\mu$m in mark length, comprising: laser beam source for emitting laser beam having wavelength of 390 to 440 nm; a reflection light detecting means for detecting a reflection light produced when the laser beam emitted from the laser beam source is reflected by the optical disc medium to read a signal from the optical disc medium, so as to reproduce the information recorded in the optical disc medium; a digital phase synchronizing means for receiving a supply of signal outputted from the reflection light detecting means and synchronizing digital phase so as to detect a phase at a data point and estimate digital data at the data point and outputting the digital data; an adaptive equalizing means including a transversal filter for equalizing in terms of waveform, the digital data outputted from the digital phase synchronizing means based on a filter coefficient, a temporary determining/subtracting circuit for while a sample after the waveform equalization outputted from the transversal filter is inputted therein, computing a temporary determining value for partial response equalization by comparing the sample with at least one threshold and outputting a differential between the temporary determining value and the sample after the waveform equalization as an error signal, and a coefficient control circuit for variably controlling a tap coefficient of the transversal filter so that the error signal becomes minimum; and a viterbi decoding means for viterbi-decoding a sample outputted from the adaptive equalizing means.

According to a preferred embodiment of the present invention, the coefficient control circuit includes an error selecting circuit for while the error signal and the temporary determining value outputted from the temporary determining means are inputted therein, selecting and outputting only valid component of the error signal depending on the temporary determining value, and a multiplier/low-pass-filter for variably controlling the tap coefficient of the transversal filter based on a signal outputted from the error selecting means such that the error signal becomes minimum.

According to another preferred embodiment of the present invention, an estimation value generating means for generating an estimation value by averaging output sample of the transversal filter for each of the at least one threshold based on the temporary determining value and the error signal outputted from the temporary determining/subtracting circuit is further comprised.

According to still another preferred embodiment of the present invention, the viterbi decoding means includes an input means for an estimation value for use in metric operation, the estimation value being capable of being controlled through the input means.

According to yet still another preferred embodiment of the present invention, the estimation value for the viterbi decoding means is provided by the estimation value generating means.

To achieve the above object, there is provided an optical disc reproducing apparatus for reproducing digital information from an optical disc medium in which the information is modulated and recorded in a recording track formed coaxially or spirally according to a signal modulation method for restricting run length such that a recording mark is 0.32 $\mu$m or more to less than 0.38 $\mu$m in track pitch and 0.12 $\mu$m or more to less than 0.22 $\mu$m in mark length, comprising: laser beam source for emitting laser beam having wavelength of 390 to 440 nm; a first reflection light detecting means for detecting a reflection light produced when the laser beam emitted from the laser beam source is reflected by the optical disc medium to read a signal from the optical disc medium, so as to reproduce the information recorded in the optical disc medium; a second reflection light detecting means for reading information separately from each of at least one pair of recording tracks on both sides of the recording track; a digital phase synchronizing means for while a signal outputted from the first reflection light detecting means is supplied thereto, digitally synchronizing phase so as to detect a phase at a data point and estimate digital data at the data point and outputting the digital data; a resampling means for while a signal outputted from the second reflection light detecting means is supplied thereto, resampling a signal from at least one recording track of the at least one pair of the recording tracks at the data point in the digital phase synchronizing means; an adaptive equalizing means including a first transversal filter for equalizing in terms of waveform, the digital data outputted from the digital phase synchronizing means based on a first filter coefficient, a temporary determining/subtracting circuit for while a sample after the waveform equalization outputted from the first transversal filter is inputted therein, computing a temporary determining value for partial response equalization by comparing the sample with at least one threshold and outputting a differential between the temporary determining value and the sample after the waveform equalization as an error signal, a second transversal filter for equalizing in waveform, the digital data outputted from the resampling means based on a second filter coefficient and generating a pseudo cross-talk signal based on an inputted tap coefficient, a subtracting means for subtracting the pseudo cross-talk signal from the sample after the waveform equalization, and a coefficient control circuit for variably controlling the tap coefficient inputted to the first and second transversal filters so that the error signal becomes minimum; and a viterbi decoding means for viterbi-decoding a sample outputted from the adaptive equalizing means.

According to a preferred embodiment of the present invention, the first coefficient control circuit includes an error selecting circuit for while the error signal and the temporary determining value outputted from the temporary determining means are inputted therein, selecting and outputting only valid component of the error signal depending on the temporary determining value, and a multiplier/low-pass-filter for variably controlling the tap coefficient of the first and second transversal filters based on a signal outputted from the error selecting means such that the error signal becomes minimum.

The nature, principle and utility of the invention will become more apparent from the following detailed description when read in conjunction with the accompanying drawings.

DESCRIPTION OF THE PREFERRED EMBODIMENTS

Figure 1:
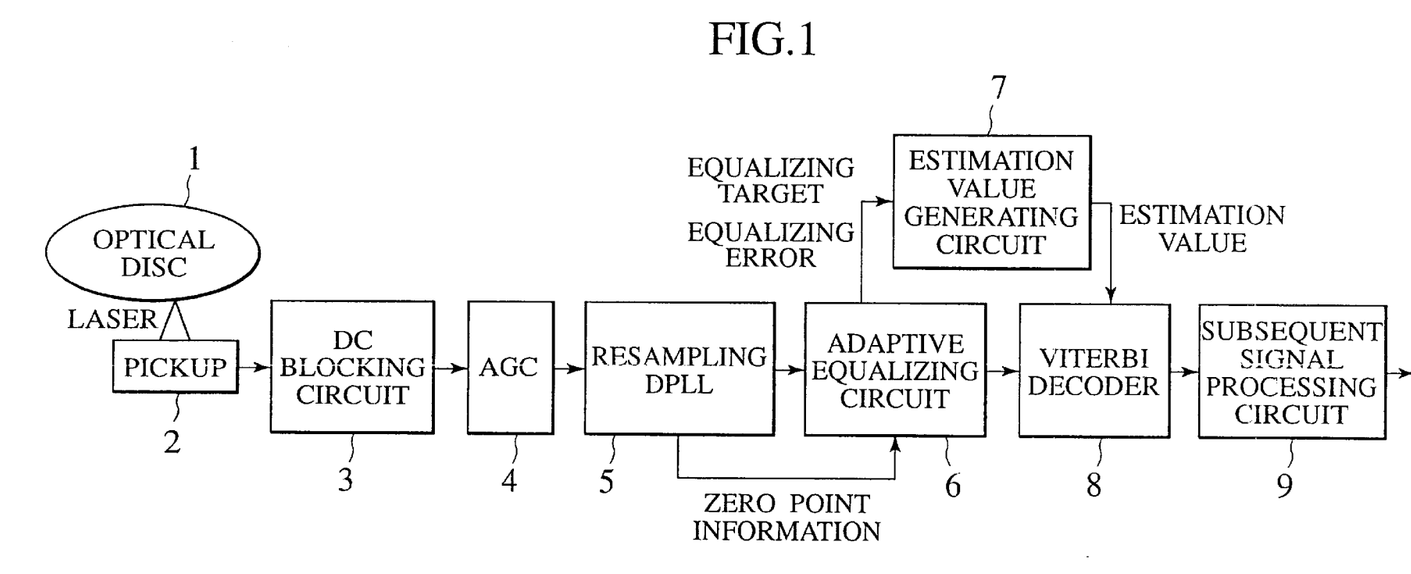
FIG. 1 is a block diagram of an optical disc reproducing apparatus according to a first embodiment of the present invention.

Hereinafter, the preferred embodiments of the present invention will be described with reference to the accompanying drawings. FIG. 1 is a block diagram showing a reproducing apparatus for optical disc of the present invention. As for the dimension of a recording mark in the optical disc 1, as described above, the track pitch is 0.32 $\mu$m or more and mark length is 0.12 $\mu$m or more. The track pitch is 0.38 $\mu$m or less and the mark length is 0.22 $\mu$m or less. An optical pickup 2 for reading information comprises a laser beam source (not shown in FIG. 1) having wavelength of 390 to 440 nm, a photo detector (PD) for receiving reflected light (not shown in FIG. 1), and an amplifying means for amplifying signals (not shown in FIG. 1). A description of a mechanical portion and a control portion for the disc and pickup operation is omitted in FIG. 1 for simplification of the description.

0.22 $\mu$m and 0.38 $\mu$m which are upper limits of the mark length and track pitch are specified as values allowing recording of information on an optical disc medium of 12 cm in diameter with practically sufficient capacity. On the other hand, 0.12 $\mu$m is a lower limit of the mark length and is specified as a value within its practical limit not to increase jitters rapidly due to thermal interference between adjacent marks. Further, 0.32 $\mu$m is a lower limit of the track pitch and is a value specified by manufacturing limit for disc.

A signal outputted from the pickup 2 is inputted to a DC block circuit 3, in which substantially DC component is removed and its amplitude is maintained constant by AGC 4. After that, sample estimation (resample) is carried out based on data point phase by a resampling DPLL 5. It is assumed that sampling output is carried out on a signal at a sampling frequency higher than bit clock at any point prior to input to resampling DPLL 5 from the PD. In the meantime, the resampling DPLL 5 corresponds to a digital phase synchronizing means.

Zero point information indicates a point where bit sampling data crosses zero level in bit clock unit. The resampling DPLL 5 operates to lock resampling timing, namely frequency and phase, so that resampling data value becomes zero at a phase 180° corresponding to zero cross point indicated by this zero point information. The resampling DPLL 5 outputs resample data and zero point information to a subsequent adaptive equalizing circuit 6 and generates a tap coefficient control signal for controlling tap coefficient of a transversal filter composing the adaptive equalizing circuit 6 so that resampling data sequence converges to a predetermined equalizing target set up by the adaptive equalizing circuit 6 based on the equalizing target and the zero point information. Because the transversal filter composing the adaptive equalizing circuit 6 will be described later, a representation thereof in FIG. 1 is omitted.

The adaptive equalizing circuit 6 controls a coefficient of the transversal filter based on an error between a predetermined equalizing target and resampling sequence to be inputted, namely an equalizing error, and outputs the equalizing error to an estimation value generating circuit 7. Meanwhile, the adaptive equalizing circuit 6 is sometimes described as an automatic equalizing means or an adaptive waveform equalizing means.

A signal from which waveform distortion is removed by the adaptive equalizing circuit 6 is decoded by a viterbi decoder 8 to binary data. In this decoding operation, like the well known viterbi decoding, branch metric and path metric are computed based on the estimation value (viterbi target value) and inputted sample, and path memory is controlled by the result of such computation so as to decode to binary data. In an embodiment shown in FIG. 1, for example, input of an estimation value may be inputted from outside.

Data binarized by the viterbi decoder 8 is subject to synchronism detection, data demodulation, descramble, ECC and the like by the subsequent signal processing circuit 9. The binarized data processed by the subsequent signal processing circuit 9 is outputted as reproduction data by an information processing means (not shown in FIG. 1).

Figure 2:
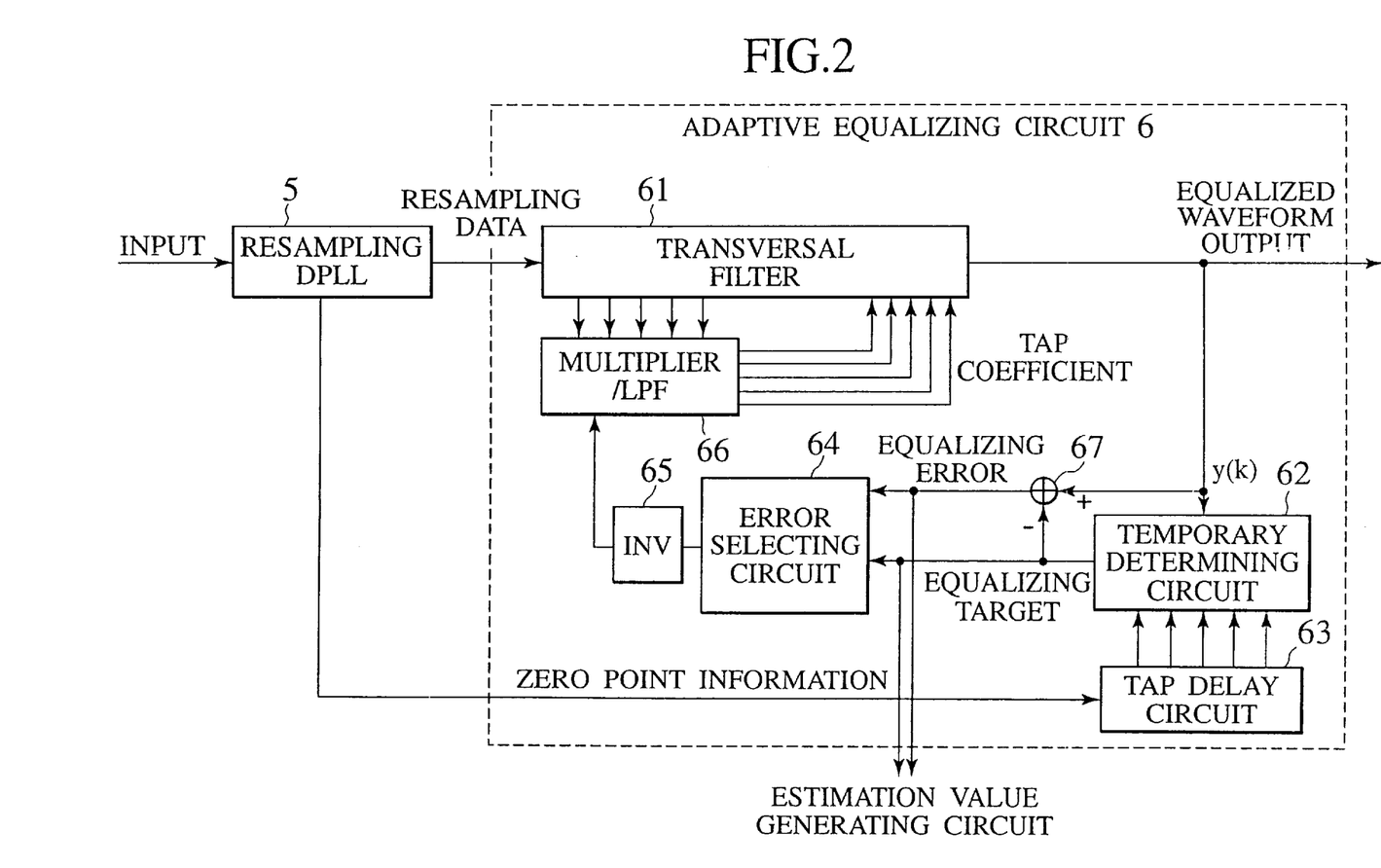
FIG. 2 is a block diagram of an adaptive equalizing circuit of the first embodiment of the present invention.

Next, each structure shown in FIG. 1 will be described further in detail. FIG. 2 is a block diagram showing an example of circuit configuration of the adaptive equalizing circuit 6 according to the first embodiment.

The adaptive equalizing circuit 6 comprises a transversal filter 61 for providing resample data from the resampling DPLL 5 with PR equalizing characteristic, a multiplier/LPF (low pass filter) 66 for changing the coefficients of the transversal filter 61 depending on an error signal, a tap delay circuit 63 for delaying zero point information from the resampling DPLL 5, a temporary determining circuit 62 for generating an equalizing target based on output signal from the transversal filter 61 and a delay signal from the tap delay circuit 63, a subtractor 67 for generating an equalizing error from a difference an input of an equalizing target outputted from the temporary determining circuit 62 and another input of an waveform equalization output, an error selecting circuit 64 for generating an error signal for controlling the tap coefficients of the transversal filter 61 based on the equalizing target outputted by the temporary determining circuit 62 and the equalizing error generated by the subtractor 67, and an inverter (INV) 65 for inverting the polarity of the error signal outputted from the error selecting circuit 64 and supplying the inverted signal to the multiplier/LPF 66.

The resampling data inputted to the adaptive equalizing circuit 6 from the resampling DPLL 5 has been eliminated waveform distortion adaptively by the transversal filter 61 whose coefficient is variable and then outputted to the viterbi decoder 8. Although the coefficients of the transversal filter 61 can be controlled by a well known algorithm such as least mean square (LMS) method, zero focusing (ZF) method and the like based on the equalizing error, i.e. a difference between the equalizing target and an output after the waveform is equalized. According to the present invention, the equalizing error is generated by the error selecting circuit 64 based on the equalizing target outputted by the temporary determining circuit 62 and the equalizing error outputted by the subtractor 67.

Figure 3:
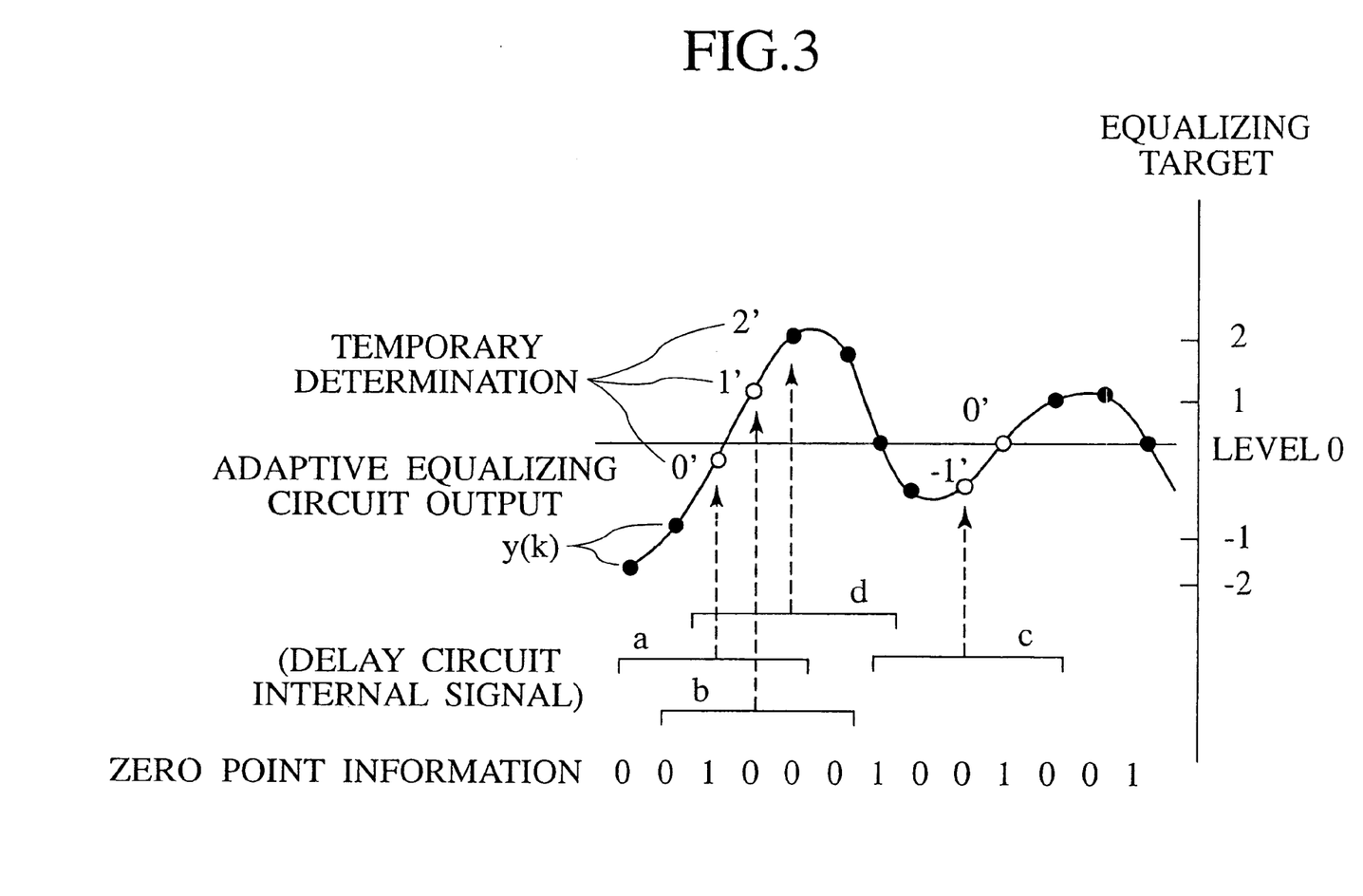
FIG. 3 is a diagram for explaining a temporary determining operation and error selecting operation.

FIG. 3 is a diagram for explaining temporary determining operation and error selecting operation. Although according to this embodiment, RLL(2, k) of run length restriction and PR (a, b, b, a) of partial response characteristic will be described as a=b=1, namely, poly binary PR(1, 1, 1, 1), it is needless to say that this embodiment can be applied to other run length restriction and other partial response characteristic.

A waveform equalization output from the transversal filter 61 and zero point information generated by the resampling DPLL 5 are inputted to the temporary determining circuit 62 through the tap delay circuit 63. The resample DPLL 5 detects a data point phase based on the phase crossing the zero level and is capable of outputting zero point information or a phase point in which input sample crosses the zero level. It is assumed that the zero point information possesses 1 at a data point estimated to be zero level.

Zero point information is inputted to the tap delay circuit 63 driven by bit clock and its timing configurates with a timing of waveform equalization output sample y(k). There provided five outputs come from the tap delay circuit 63 so that the equalizing target can be estimated from a center point, namely the third bit, of the five points of zero point information.

Referring to an example shown in FIG. 3, the estimation value is 0' ((x') indicates the estimation value here) in case of 00100 (case a shown in FIG. 3), the estimation value is 1' in case where sample y(k) is positive in 01000 (case b shown in FIG. 3), the estimation value is -1' in case where y(k) is negative in 10010 (case c shown in FIG. 3), the estimation value is 2' in case where y(k) is positive in 10001 (case d shown in FIG. 3)

The temporary determining circuit 62 outputs the estimation value as the equalizing target, and assuming that the estimation value at k sample is x(k)', the equalizing error in the subtractor 67 is a difference between the waveform equalization output and the equalizing target, namely y(k)−x(k)'. The temporary determining circuit 62 can be composed of a logical circuit and the like.

The error selecting circuit 64 operates to select an equalizing error for use in correcting the coefficient of the transversal filter 61 from equalizing errors generated by the subtractor 67. For example, in case of reproduced waveform poor in symmetry because of nonlinear distortion caused by the aforementioned pit formation problem, only equalizing errors corresponding to the equalizing targets 1', 0', -1' having relatively small distortion are selected to correct the tap coefficient. Then, it is possible to determine and select an equalizing error based on an equalizing target outputted from the temporary determining circuit 62. Instead, it is possible to determine in advance which error should be selected or it is possible to monitor signal quality with another circuit and determine an equalizing error depending on its result.

Figure 4:
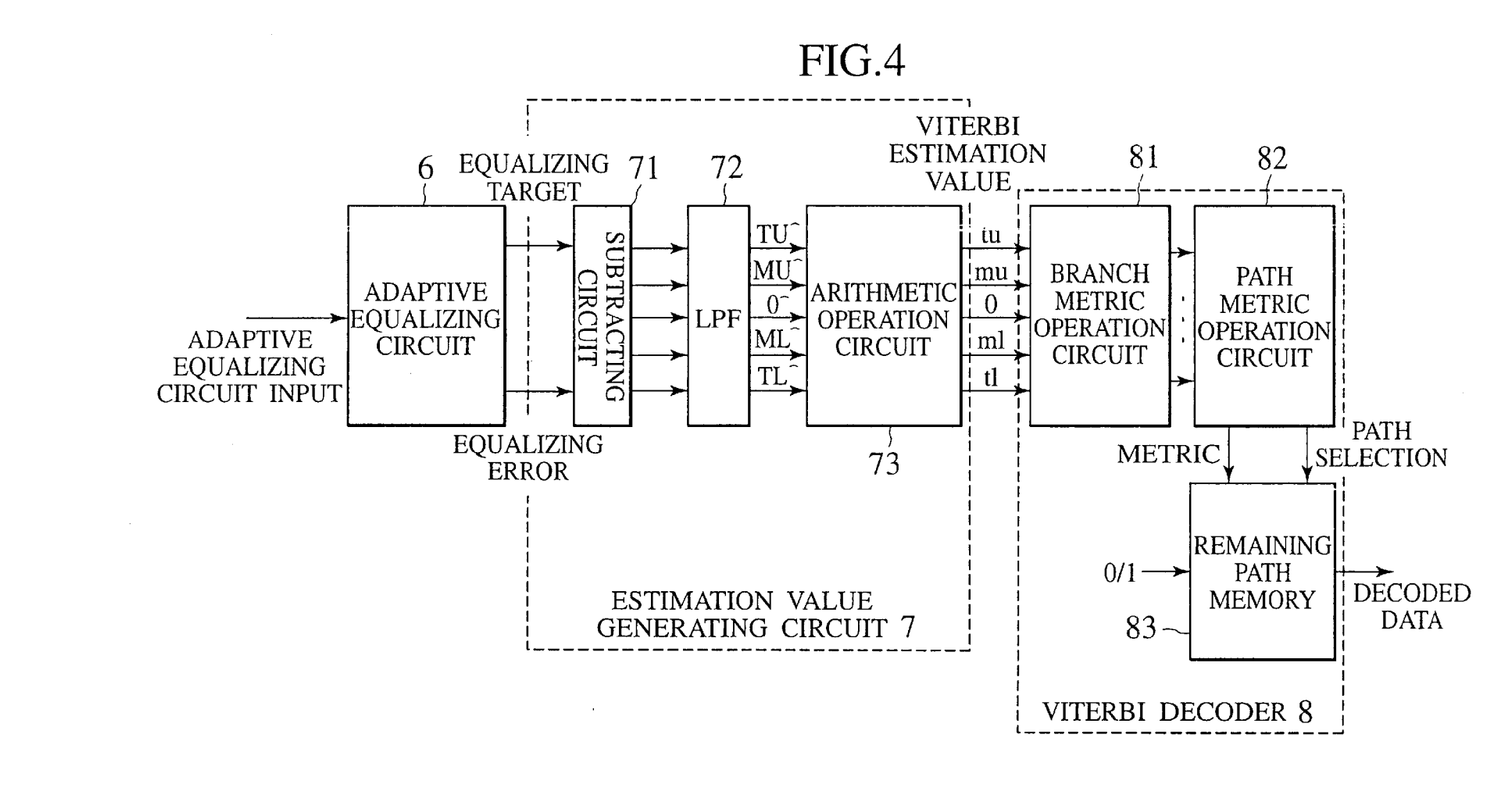
FIG. 4 is a block diagram of an example of concrete circuit configuration for an estimation value generating circuit and a viterbi decoder.

FIG. 4 is a block diagram of an example of a concrete circuit configuration of the estimation value generating circuit 7 and the viterbi decoder 8. The estimation value generating circuit 7 comprises a subtracting circuit 71 for the equalizing target and equalizing error, a LPF (low pass filter) 72 for averaging the output of the subtracting circuit 71 for each equalizing target (although five target values are provided in this example, apparently the number of the equalizing target value changes according to other partial response method), and an arithmetic operation circuit 73 for generating an estimation value (indicating tu, mu, o, m1, t1 in the same Figure) to be given to the viterbi decoding circuit using the output of the LPF for each equalizing target. It is needless to say that the subtracting circuit 71 may act as the subtractor 67 at the same time.

The difference between the equalizing target and the equalizing error is a sample outputted actually from the adaptive equalizing circuit 6 and then, sample average values (indicated by TU^, MU^, 0^, ML^, TL^) are obtained by averaging the samples for each equalizing target.

After that, if the symmetry is poor so that convergence of sample corresponding to outside samples (TU^, TL^) is poor, as an example, an arithmetic operation like tu=−t1=(TU^−TL^)/2 is carried out so as to correct two outside viterbi estimation values and then outputted to the viterbi decoder 8.

The viterbi decoder 8 carries out branch metric operation with the branch metric operation circuit 81 based on the corrected viterbi estimation values and carries out path metric operation with the path metric operation circuit 82 based on branch metric obtained by the branch metric operation circuit 81, controls the path memory with remaining path memory portion 83 and outputs decoded data. A viterbi estimation value in an initial state before correction is set up to, for example, an equalizing target.

Figure 5:
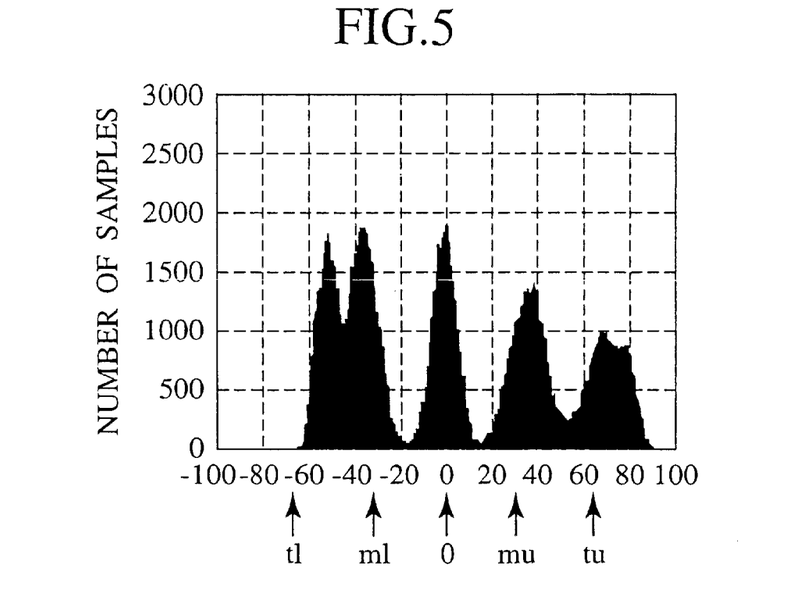
FIG. 5 is a histogram of samples of data point at the time of reproduction or a histogram without selection of an error.
Figure 6:
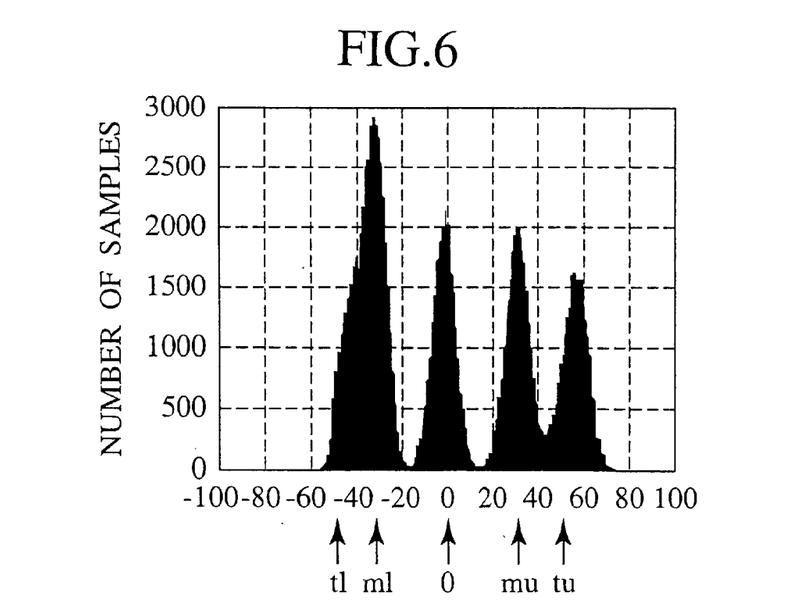
FIG. 6 is a histogram of samples of data point at the time of reproduction or a histogram with selection of an error.

FIG. 5 is an example of histogram of data point samples obtained when reproducing a ROM disc formed with track pitch of 0.341 μm and shortest mark length of 0.22 μm in wavelength of 405 nm or a sample histogram at the time when the coefficient of the transversal filter is corrected by using the equalizing errors of all waveform equalization output samples having poor symmetry in waveform without selecting the error. FIG. 6 is a histogram obtained at the time of tap correction by selecting only the equalizing error for samples corresponding to three values, 1, 0, −1. The axis of ordinate in FIGS. 5, 6 indicates the quantity of samples and the axis of abscissa indicates the estimation value of the viterbi decoder in case where the arithmetic operation mentioned in the above embodiment is carried out.

Although in FIG. 5, the waveform distortion is large and convergence is poor at all sample points, particularly convergence is very poor at outside sample, it is obvious that the convergence is improved at the time of error selection in FIG. 6.

Figure 7:
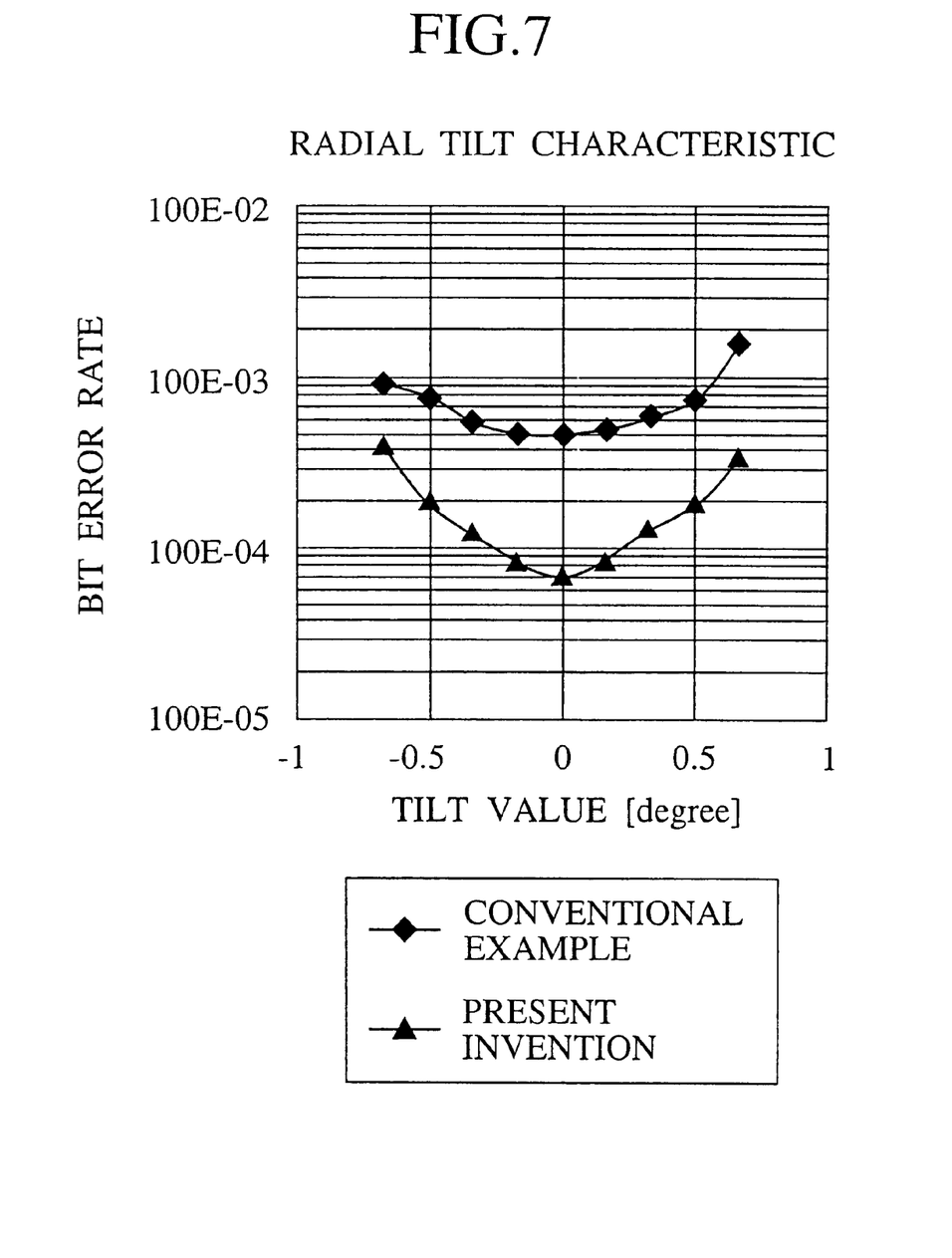
FIG. 7 is a diagram showing radial tilt characteristic.
Figure 8:
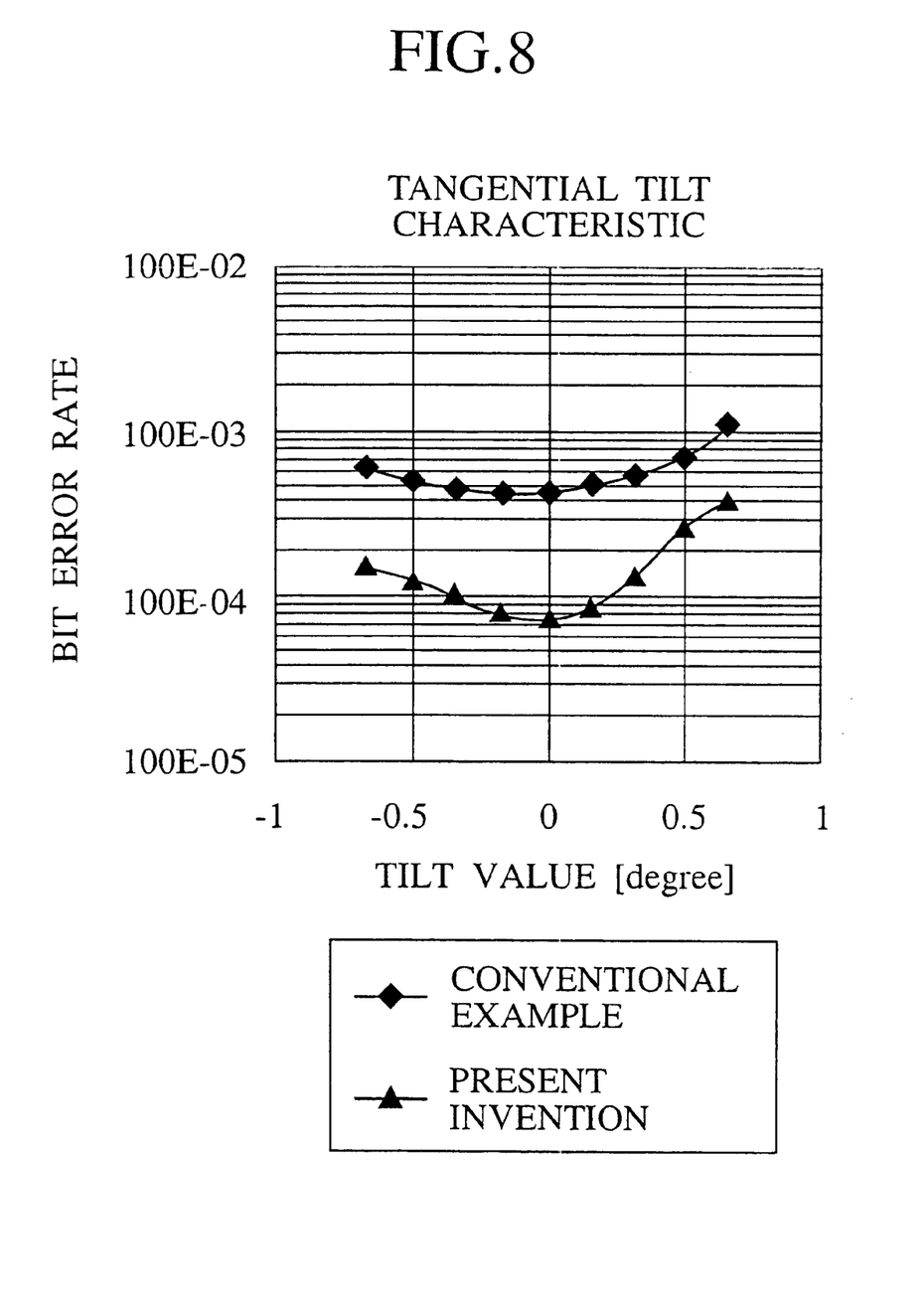
FIG. 8 is a diagram showing tangential tilt characteristic.

FIGS. 7, 8 are diagrams showing a tilt margin of the embodiment of the present invention. Measured values according to a conventional example and the present invention are shown about radial tilt (FIG. 7) and tangential tilt (FIG. 8) respectively. According to the present invention, the tilt margin becomes large in any case, so that its effect is obvious. By constructing an optical disc reproducing apparatus with a means capable of obtaining an equalized waveform in a good state even if the recording mark dimension and track pitch are small, a viterbi decoding means in which the estimation value can be set up from outside, and a means for maintaining the estimation value to be given to the viterbi decoder from the means for obtaining the equalized waveform constantly in a good condition, as described above, signals can be reproduced in a good condition from an optical disc having track pitch of 0.32 μm or more to less than 0.38 μm and mark length of 0.12 μm to less than 0.22 μm, which dimensions had not been allowing signals to be reproduced properly. As a result, the influence of nonlinear distortion caused by pit formation in a high recording density ROM or rewritable disc, cross-talk between adjacent tracks, disc tilt and the like can be minimized.

Next, a second embodiment of the present invention will be described. According to the second embodiment, the pickup 2 shown in FIG. 1 has at least another second reflected light detecting means in addition to the PD which is the first reflected light detecting means. In subsequent circuit configuration up to the transversal filter also, plural circuits are provided in parallel to each other.

Figure 9:
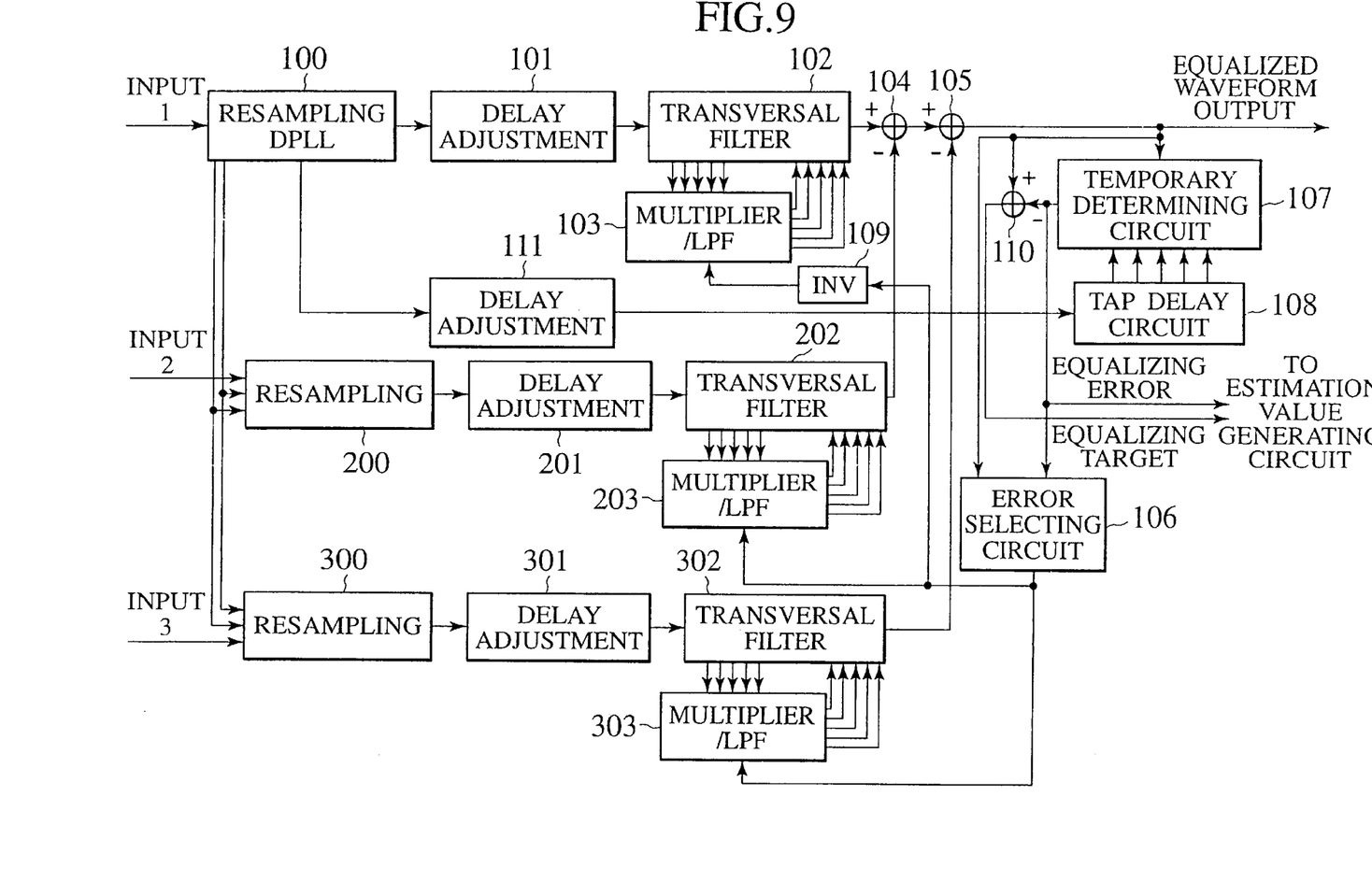
FIG. 9 is a block diagram of an adaptive equalizing circuit according to a second embodiment of the present invention.

FIG. 9 is a diagram showing a second embodiment of the present invention. Although this example shows a waveform equalizing circuit for using three-divided emission light or so-called three beams, this is applicable for other number of beams.

In FIG. 9, a signal obtained from main beam output is inputted to input 1 and signals obtained from two sub-beams (preceding beam, following beam) are inputted to inputs 2, 3. Here, the sub-beam signals are input signals from tracks adjacent to the main beam. A resampling DPLL 100 is connected to the input 1 so as to estimate data point phase and data point sample. After this, the signal is inputted to a delay circuit 101, which is provided to absorb a time difference between the preceding beam input 2 and following beam input 3 with respect to the main beam input 1. A subsequent operation is equal to the above described adaptive equalizing circuit 6 and therefore a description thereof is omitted.

Data point phase and bit clock are outputted from the resampling DPLL 100 to the resampling circuits 200, 300 corresponding to the inputs 2, 3, respectively. Based on the bit clock and data point phase signal, signal sample in data point phase of the main beam is obtained from the inputs 2, 3. The delay circuits 201, 301 corresponding to the inputs 2, 3 respectively are circuits for time delay so as to obtain a sample having the same phase as the sample of the input 1.

Figure 10A:
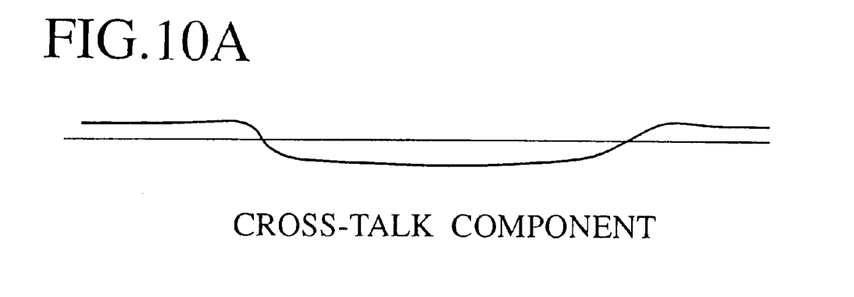
FIGS. 10A–10C are diagrams for explaining an operation of the second embodiment of the present invention.
Figure 10B:
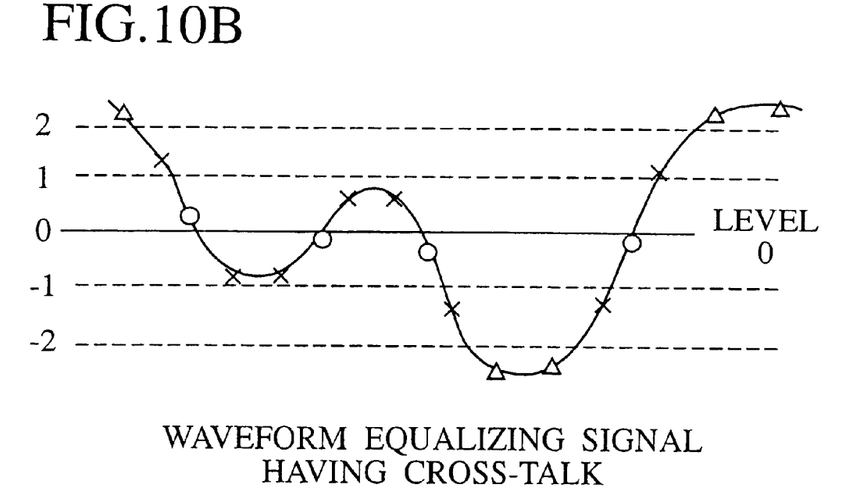

An operation of the second embodiment will be described with reference to FIGS. 10A to 10C. FIG. 10A shows a cross-talk component mixed in a signal outputted from the main beam. The cross-talk component affects the main beam signal as a nonlinear distortion and cannot be removed by waveform equalization for the main beam of the input 1. As a result, the cross-talk component is multiplexed as remaining error as shown in FIG. 10B, so that the error is increased.

Figure 10C:
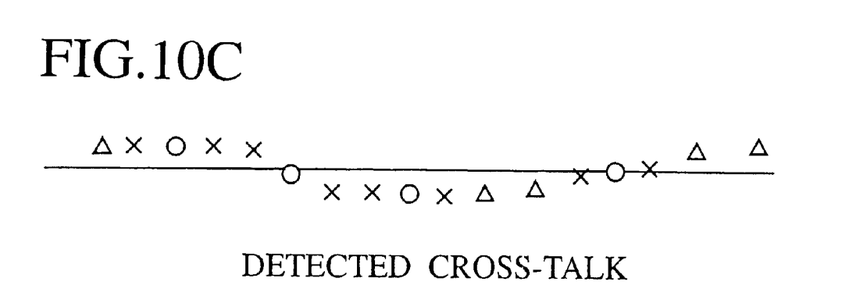

The sub-beam input signal inputted to the inputs 2, 3 are a factor of the cross-talk, which is shown in FIG. 10C. The remaining error at data point obtained from the main beam signal i.e. the cross-talk component, can be detected as a pseudo cross-talk in a loop containing transversal filters 202, 302 connected to the inputs 2, 3 of FIG. 9 and multiplier/LPFs 203, 303. Consequently, a signal from which the cross-talk is removed can be detected by reducing the pseudo cross-talk from the main beam waveform equalization output with the subtractors 104, 105.

That is, although as regards the coefficients of the transversal filters 202, 302, negative feedback loop is so constructed that an error outputted from the error selecting circuit 106 is to be small, of errors outputted from the error selecting circuit 106, an error caused by linear distortion due to simple interference between codes is corrected by main beam waveform equalizing loop and an equalizing error which cannot be corrected remains as remaining error (FIG. 10A).

The remaining error acts as an equalizing error signal (remaining equalizing error) to sub-beam loop. The remaining equalizing error is generated as pseudo cross-talk component by a circuit means comprising the transversal filters 202, 302 connected to the sub-beams and the multiplier/LPFs 203, 303 respectively, and is removed by the subtractors 104, 105 so that the remaining equalizing error can be small.

Because the error selecting circuit 106, the temporary determining circuit 107, the tap delay circuit 108, the inverter (INV) 109, and the multiplier/LPF 103 shown in FIG. 9 are attached thereto for the same purpose of the first embodiment, error selection for the main beam as well as the sub-beam is enabled.

The circuit configuration and operation of the viterbi decoder 8 and estimation value generating circuit 7 connected to the adaptive equalizing circuit according to the second embodiment are the same as the viterbi decoder 8 and estimation value generating circuit 7 described in the first embodiment and therefore, a description thereof is omitted respectively. As described above, according to the second embodiment, a preferable reproduced signal can be obtained for a signal having a large amount of cross-talks.

In the optical reproducing apparatus of the present invention, reproduction from the high density ROM or rewritable disc, which is conventionally difficult, can be carried out preferably and further, there is an advantage that system margin such as tilt margin and recording power margin is increased.

It should be understood that many modifications and adaptations of the invention will become apparent to those skilled in the art and it is intended to encompass such obvious modifications and changes in the scope of the claims appended hereto.

What is claimed is:

1. An optical disc reproducing apparatus for reproducing digital information from an optical disc medium in which the information is modulated and recorded in a recording track formed coaxially or spirally according to a signal modulation method for restricting run length such that a recording mark is 0.32 $\mu$m or more to less than 0.38 $\mu$m in track pitch and 0.12 $\mu$m or more to less than 0.22 $\mu$m in mark length, comprising:

laser beam source for emitting laser beam having wavelength of 390 to 440 nm;

a reflection light detecting means for detecting a reflection light produced when the laser beam emitted from the laser beam source is reflected by the optical disc medium to read a signal from the optical disc medium, so as to reproduce the information recorded in the optical disc medium;

a digital phase synchronizing means for receiving a supply of signal outputted from the reflection light detecting means and digitally synchronizing phase so as to detect a phase at a data point phase and estimate digital data at the data point and outputting the digital data;

an adaptive equalizing means including a transversal filter for equalizing in terms of waveform, the digital data outputted from the digital phase synchronizing means based on a filter coefficient, a temporary determining/subtracting circuit for while a sample after the waveform equalization outputted from the transversal filter is inputted therein, computing a temporary determining value for partial response equalization by comparing the sample with at least one threshold and outputting a differential between the temporary determining value and the sample after the waveform equalization as an error signal, and a coefficient control circuit for variably controlling a tap coefficient of the transversal filter so that the error signal becomes minimum; and a viterbi decoding means for viterbi-decoding a sample outputted from the adaptive equalizing means.

2. An optical disc reproducing apparatus according to claim 1 wherein the coefficient control circuit includes an error selecting circuit for while the error signal and the temporary determining value outputted from the temporary determining means are inputted therein, selecting and outputting only valid component of the error signal depending on the temporary determining value, and a multiplier/low-pass-filter for variably controlling the tap coefficient of the transversal filter based on a signal outputted from the error selecting means such that the error signal becomes minimum.

3. An optical disc reproducing apparatus according to claim 1 further comprising an estimation value generating means for generating an estimation value by averaging output sample of the transversal filter for each of the at least one threshold based on the temporary determining value and the error signal outputted from the temporary determining/subtracting circuit.

4. An optical disc reproducing apparatus according to claim 2 wherein the viterbi decoding means includes an input means for an estimation value for use in metric operation, the estimation value being capable of being controlled through the input means.

5. An optical disc reproducing apparatus according to claim 4 wherein the estimation value for the viterbi decoding means is provided by the estimation value generating means.

6. An optical disc reproducing apparatus for reproducing digital information from an optical disc medium in which the information is modulated and recorded in a recording track formed coaxially or spirally according to a signal modulation method for restricting run length such that a recording mark is 0.32 $\mu$m or more to less than 0.38 $\mu$m in track pitch and 0.12 $\mu$m or more to less than 0.22 $\mu$m in mark length, comprising:

laser beam source for emitting laser beam having wavelength of 390 to 440 nm;

a first reflection light detecting means for detecting a reflection light produced when the laser beam emitted from the laser beam source is reflected by the optical disc medium to read a signal from the optical disc medium, so as to reproduce the information recorded in the optical disc medium;

a second reflection light detecting means for reading information separately from each of at least one pair of recording tracks on both sides of the recording track;

a digital phase synchronizing means for while a signal outputted from the first reflection light detecting means is supplied thereto, digitally synchronizing phase so as to detect a phase at a data point and estimate digital data at the data point and outputting the digital data;

a resampling means for while a signal outputted from the second reflection light detecting means is supplied thereto, resampling a signal from at least one recording track of the at least one pair of the recording tracks at the data point in the digital phase synchronizing means;

an adaptive equalizing means including a first transversal filter for equalizing in terms of waveform, the digital data outputted from the digital phase synchronizing means based on a first filter coefficient, a temporary determining/subtracting circuit for while a sample after the waveform equalization outputted from the first transversal filter is inputted therein, computing a temporary determining value for partial response equalization by comparing the sample with at least one threshold and outputting a differential between the temporary determining value and the sample after the waveform equalization as an error signal, a second transversal filter for equalizing in waveform, the digital data outputted from the resampling means based on a second filter coefficient and generating a pseudo cross-talk signal based on an inputted tap coefficient, a subtracting means for subtracting the pseudo cross-talk signal from the sample after the waveform equalization, and a coefficient control circuit for variably controlling the tap coefficient inputted to the first and second transversal filters so that the error signal becomes minimum; and a viterbi decoding means for viterbi-decoding a sample outputted from the adaptive equalizing means.

7. An optical disc reproducing apparatus according to claim 6 wherein the coefficient control circuit includes an error selecting circuit for while the error signal and the temporary determining value outputted from the temporary determining means are inputted therein, selecting and outputting only valid component of the error signal depending on the temporary determining value, and a multiplier/low-pass-filter for variably controlling the tap coefficient of the first and second transversal filters based on a signal outputted from the error selecting means such that the error signal becomes minimum.

8. An optical disc reproducing apparatus according to claim 6 further comprising an estimation value generating means for generating an estimation value by averaging output sample of the first and second transversal filters for each of the at least one threshold based on the temporary determining value and the error signal outputted from the temporary determining/subtracting circuit.

9. An optical disc reproducing apparatus according to claim 7 wherein the viterbi decoding means includes an input means for an estimation value for use in metric operation, the estimation value being capable of being controlled through the input means.

10. An optical disc reproducing apparatus according to claim 9 wherein the estimation value for the viterbi decoding means is provided by the estimation value generating means.

* * * * *